(12) United States Patent
Chang et al.

(10) Patent No.: US 9,224,691 B2
(45) Date of Patent: Dec. 29, 2015

(54) SEMICONDUCTOR DEVICE CONTACT STRUCTURES

(71) Applicant: Taiwan Semiconductor Manufacturing Co., Ltd., Hsin-Chu (TW)

(72) Inventors: Shih-Chieh Chang, Taipei (TW); Chih-Chung Chang, Tainan (TW); Kei-Wei Chen, Tainan (TW); Ying-Lang Wang, Lung-Jing Country (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 84 days.

(21) Appl. No.: 13/961,908

(22) Filed: Aug. 8, 2013

(65) Prior Publication Data

US 2013/0320541 A1 Dec. 5, 2013

Related U.S. Application Data

(62) Division of application No. 13/049,049, filed on Mar. 16, 2011, now Pat. No. 8,518,819.

(51) Int. Cl.
*H01L 23/532* (2006.01)
*H01L 23/485* (2006.01)
*H01L 21/285* (2006.01)
*H01L 21/768* (2006.01)

(52) U.S. Cl.
CPC ...... *H01L 23/53266* (2013.01); *H01L 21/2855* (2013.01); *H01L 21/76805* (2013.01); *H01L 21/76814* (2013.01); *H01L 21/76846* (2013.01); *H01L 23/485* (2013.01); *H01L 23/53238* (2013.01); *H01L 2924/0002* (2013.01)

(58) Field of Classification Search
CPC .............. H01L 23/485; H01L 21/2855; H01L 21/76805; H01L 21/76814; H01L 21/76846; H01L 23/53238; H01L 23/53266
USPC .......... 257/751, E21.575, 741, 761, 659, 758, 257/329
See application file for complete search history.

(56) References Cited

U.S. PATENT DOCUMENTS

| 5,693,563 | A | 12/1997 | Teong |
| 5,814,557 | A | 9/1998 | Venkatraman et al. |
| 2006/0263995 | A1 | 11/2006 | Sandhu |
| 2009/0014878 | A1* | 1/2009 | Cabral et al. ................. 257/751 |

* cited by examiner

*Primary Examiner* — Cathy N Lam
(74) *Attorney, Agent, or Firm* — Duane Morris LLP

(57) ABSTRACT

Semiconductor contact structures extend through a dielectric material and provide contact to multiple different subjacent materials including a silicide material and a non-silicide material such as doped silicon. The contact structures includes a lower composite layer formed using a multi-step ionized metal plasma (IMP) deposition operation. A lower IMP film is formed at a high AC bias power followed by the formation of an upper IMP film at a lower AC bias power. The composite layer may be formed of titanium. A further layer is formed as a liner over the composite layer and the liner layer may advantageously be formed using CVD and may be TiN. A conductive plug material such as tungsten or copper fills the contact openings.

20 Claims, 3 Drawing Sheets

US 9,224,691 B2

SEMICONDUCTOR DEVICE CONTACT STRUCTURES

CROSS-REFERENCE TO RELATED APPLICATIONS

This application is a division of U.S. patent application Ser. No. 13/049,049, filed Mar. 16, 2011, the entirety of which is incorporated by reference herein.

TECHNICAL FIELD

The present disclosure relates, most generally, to semiconductor devices and manufacturing methods for fabricating semiconductor devices. More particularly, the present disclosure relates to methods and contact structures with reduced contact resistance.

BACKGROUND

In the rapidly advancing world of semiconductor device technology, integrated circuit and other semiconductor devices are being formed with increased complexities and with features that include increasingly smaller dimensions. Even though such semiconductor devices are being formed to increased integration levels and increased complexity levels, the drive to increase device speed continues in a most aggressive manner.

In addition to being determined by device design, i.e. the layout of the device, device speed is heavily dependent upon the nature and composition of the conductive materials used in the manufacture of the device and also the contacts between the different conductive features of the device. As device complexities continue to increase and as advanced new conductive materials continue to be developed, various types of contacts are utilized and it is desirable to minimize the contact resistance associated with each of the contacts. Contacts are formed at various levels in the semiconductor device and between various conductive features that are disposed at various levels of the device. Furthermore, in order to fabricate semiconductor devices most efficiently and using an economy of processing operations, it is useful to form various different types of contacts using the same processing operations. For example, contacts through different kinds of material may be simultaneously formed using the same sequence of processing operations.

It is advantageous to form multiple different contacts extending through a dielectric layer or layers, simultaneously, even if the subjacent materials to which contact is made, are different materials. One example is in CMOS, complementary metal oxide semiconductor technology, for example in CIS (CMOS image sensors), and flash memory devices in which it may be desirable to form contacts to different materials through the same dielectric layer or layers simultaneously, using the same sequence of processing operations.

When contacts extend through a particular dielectric layer or layers to different subjacent materials, the electrical requirements of the different contacts make it difficult to form the contacts using the same set of processing operations. For example, the sequence of processing operations that may advantageously be used to form a contact structure that contacts a silicide surface, may utilize processing conditions and characteristics that render the contact structure incapable of satisfying the electrical requirements of other contacts.

Structures and methods that address the above shortcomings and limitations are needed.

BRIEF DESCRIPTION OF THE DRAWING

The embodiments are best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION OF THE EMBODIMENTS

The embodiments provide a structure and method for simultaneously forming contacts to various underlying surfaces such that the contact structures provide sufficiently low contact resistance and satisfy the electrical performance required of the different contact surfaces.

Figure 1:
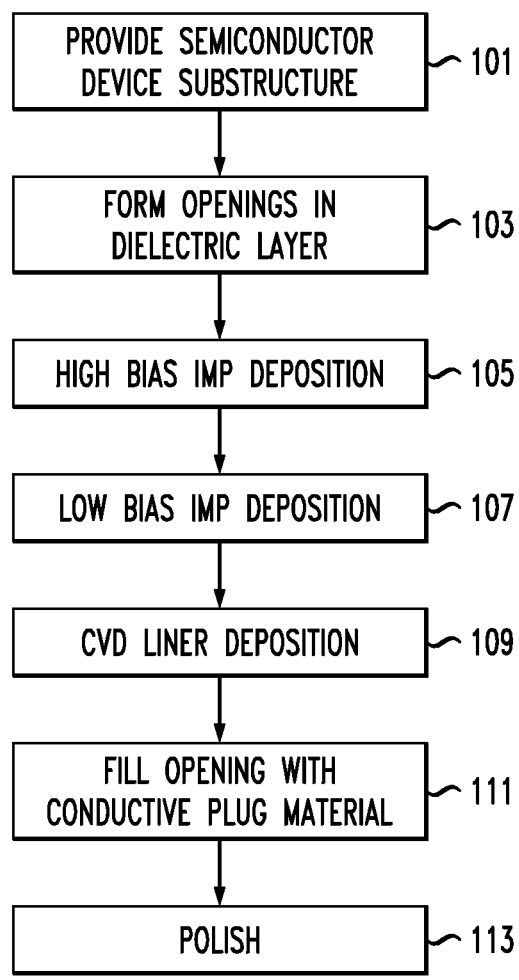
FIG. 1 is a flow chart showing an exemplary method of the disclosure.

FIG. 1 is a flow chart of an exemplary method according to embodiments of the disclosure. Aspects of the method steps provided in the flow chart of FIG. 1, are illustrated in the cross-sectional views of FIGS. 2-5 that illustrate the exemplary sequence of processing operations of FIG. 1.

At step 101 of FIG. 1, a semiconductor device substructure is provided and includes at least one dielectric layer. Contact openings are formed in the dielectric layer or layers of the semiconductor device substructure at step 103. An exemplary contact structure may be formed in the opening using a first high bias ionized metal plasma (IMP) deposition step at step 105 followed by a second low-bias IMP deposition step at step 107. Chemical vapor deposition, CVD, may be used to form a liner layer at step 109 and the contact opening is filled with a conductive plug material such as W or Cu at step 111. The structure may be polished at step 113. Various suitable polishing methods such as CMP, chemical mechanical polishing, may be used. The preceding processing operations illustrated in FIG. 1 are exemplary and not limiting, and in other exemplary embodiments, other deposition techniques may be used. For example, other PVD, physical vapor deposition, methods may be used instead of the IMP deposition steps shown at steps 105 and 107.

Figure 2:
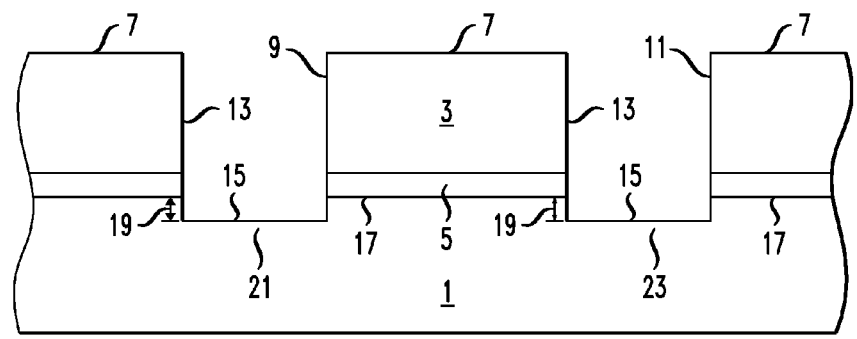
FIGS. 2-5 are cross-sectional views illustrating a sequence of processing operations used to form an exemplary embodiment of contact structures.

FIG. 2 is a cross-sectional view of a semiconductor device substructure and illustrates a duality of exemplary contact openings formed in a semiconductor device. The semiconductor device represented by FIG. 2 may be any of various different types of semiconductor devices including but not limited to CMOS image sensors, CIS, flash cell devices, and any of various other logic, microprocessor, memory or other integrated circuit or other semiconductor devices.

Substrate 1 may be any of various substrates suitable for semiconductor device manufacturing. Substrate 1 may be formed of silicon, III-V compound materials, other suitable semiconductor materials, or other suitable materials used as substrates in the manufacture of semiconductor devices. Substrate 1 may have a plurality of semiconductor devices (e.g., transistors or diodes, not shown) formed at its surface. Dielectric layer 3 is formed over substrate 1 and also over optional contact etch stop layer 5. Dielectric layer 3 may be an oxide, oxynitride, various nitride materials, porous low-k dielectric or any of various high-k or low-k dielectric materials used in the semiconductor manufacturing industry or combinations thereof. Dielectric layer 3 may have a thickness of about 1000 A to about 10000 A. Dielectric layer 3 may represent a composite structure of multiple dielectric layers and includes top surface 7. Optional contact etch stop layer 5 may be formed of silicon nitride or other suitable materials in the semiconductor manufacturing industry, in embodiments in which it is utilized. Contact openings 9 and 11 are formed through dielectric layer 3 and also through optional contact etch stop layer 5 and terminate at substrate 1. Contact openings 9 and 11 may be formed using various suitable photolithography and etching techniques and include respective sidewalls 13 and bottom surfaces 15. In the illustrated embodiment, bottom surfaces 15 are recessed with respect to substrate surface 17. Bottom surfaces 15 are recessed by distance 19 which may be up to about 150 angstroms in various exemplary embodiments but in other exemplary embodiments, bottom surfaces 15 are not recessed and may essentially be coplanar with substrate surface 17. The recess may be created intentionally or unintentionally as a result of over-etching when forming contact openings 9 and 11.

Bottom surfaces 15 are formed of first material 21 and second material 23, respectively. Each of bottom surfaces 15 formed of first material 21 and second material 23, represent a contact surface and the contact surface may be part of an interconnection structure or other device not illustrated in FIG. 2. For example, one or more of the surfaces 15 may be source/drain diffusion regions of a transistor, or an electrode of a capacitor. In some exemplary embodiments, first material 21 and second material 23 are the same material, while in other exemplary embodiments, they may represent different materials. According to one exemplary embodiment, first material 21 may be a silicide material and second material 23 may be a non-silicide material such as silicon. According to the exemplary embodiment in which the non-silicide material is silicon, the silicon may be a doped material, i.e. the silicon material may include any of various dopant impurities therein. The dopant impurities may be at any of various concentration levels. The inclusion of two contact openings 9, 11 extending down to bottom surfaces 15 which may be formed of different materials is intended to be exemplary only, and in other exemplary embodiments, a number of additional contact openings may be formed to extend down to respective bottom surfaces and the bottom surfaces may be formed of the same materials or a plurality of different materials.

Figure 3:
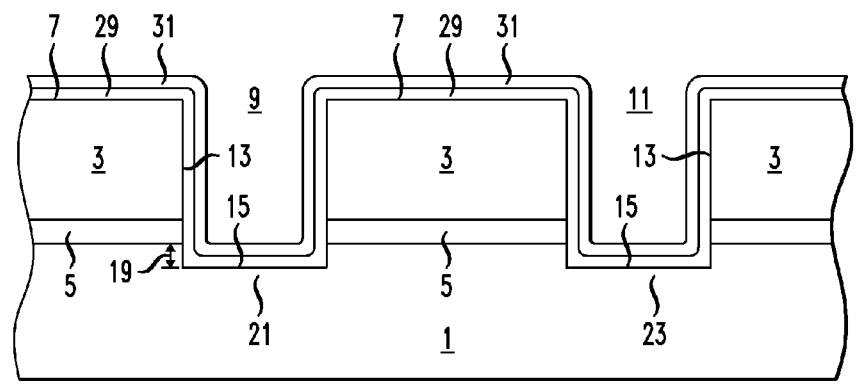

Prior to the deposition of films such as shown in FIG. 3, an optional cleaning process may be carried out upon the structure shown in FIG. 2. Various suitable cleaning operations may be used. According to one exemplary embodiment, an argon plasma dry clean operation may be carried out and the cleaning operation may include a power of no more than 500 watts and may take place for a time period ranging from about 0 to about 20 seconds. The dry clean operation may erode bottom surface 15 of the contact opening and in some embodiments may etch about 30 Å of first material 21 and/or second material 23 of bottom surfaces 15. The subsequent multi-level contact structure liner deposition processes render the Ar or other dry cleaning operation optional. The dry cleaning operation is not needed in various exemplary embodiments, but may be used for a minimal time and under non-aggressive conditions in other exemplary embodiments, such as to minimize any damage to bottom surfaces 15.

FIG. 3 shows the structure of FIG. 2 after a composite base layer of two films has been formed. Lower film 29 and upper film 31 may be sequentially formed using IMP, ionized metal plasma, processing techniques, and may be formed using various processing parameters, conditions and characteristics. In other exemplary embodiments, other PVD operations may be used to form lower film 29 and upper film 31. Lower film 29 is advantageously formed using a higher bias power than upper film 31.

Lower film 29 is formed over top surface 7, along sidewalls 13 and on bottom surfaces 15, using a high bias IMP process, with a high AC bias power that may range from about 700 watts to about 1500 watts according to one exemplary embodiment. Other power levels may be used in other exemplary embodiments. Lower film 29 may include a thickness of at least 20 angstroms and may be about 20 angstroms to 50 angstroms in one exemplary embodiment, but greater thicknesses may be used in other exemplary embodiments. Upper film 31 is advantageously formed at a lower AC bias power than lower film 29 and may be formed using IMP with an AC bias power of about 200 watts to 700 watts. According to one exemplary embodiment, lower film 29 is formed at an AC bias power that is at least 500 watts greater than the AC bias power used to form upper film 31. Applicants have discovered that the use of the two-step IMP deposition process with a first step having a high AC bias power in the range of 700 W to 1500 W provides a dramatic improvement in contact resistance for non-silicide contacts compared to a single low AC bias power deposition operation in the range of 300 W to 700 W. Various other suitable processing parameters may be used to generate the plasma and control the deposition environment. In one exemplary embodiment, both lower film 29 and upper film 31 are formed at a DC power of about 1500 watts to 2500 watts and at a DC coil power of about 1000 watts to 1500 watts but such parameters and values are intended to be exemplary only.

Upper film 31 may be formed to include a thickness of at least about 50 angstroms in one exemplary embodiment. Upper film may include a thickness of about 50 angstroms-100 angstroms in another exemplary embodiment, but other thicknesses may be used in other exemplary embodiments. The combined thickness of lower film 29 and upper film 31 may range from about 70 angstroms to about 400 angstroms in one exemplary embodiment and the applicants have discovered that a combined thickness of about 250 Å provides a dramatic improvement of over 350% in contact resistance for non-silicide contacts compared to a combined thickness of about 130 Å.

The exemplary thicknesses recited herein are understood to be film thicknesses over top surface 7 and along the bottom of the contact openings, i.e. over bottom surfaces 15 as the thicknesses of the respective films along sidewalls 13 may differ depending on aspect ratio of contact openings 9, 11, film conformality, and other film deposition characteristics. In one exemplary embodiment, each of lower film 29 and upper film 31, which combine to form a composite base layer, may be composed of titanium, Ti, but in other exemplary embodiments, other materials such as cobalt, Co, or other suitable materials may be used. Lower film 29 and upper film 31 may be formed in-situ or using other techniques.

Lower film 29, formed at a higher AC bias power than upper film 31 advantageously includes a lower resistivity than upper film 31. Lower film 29 may include a resistivity of less than about 95 uohm-cm and upper film 31 may include a resistivity greater than about 95 uohm-cm in one exemplary embodiment, but other resistivities may be achieved in other exemplary embodiments.

Figure 4:
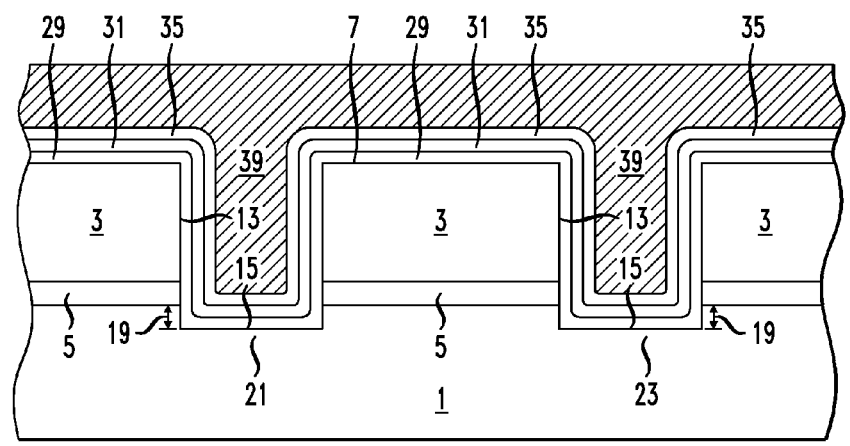

Liner layer 35 is formed over the structure shown in FIG. 3, as illustrated in FIG. 4. Liner layer 35 may be formed of TiN, WN, or other suitable nitride or other materials, in other exemplary embodiments. Liner layer 35 may be formed over upper film 31 using chemical vapor deposition, CVD, techniques according to some exemplary embodiments. Other deposition techniques may alternatively be used in other exemplary embodiments. Liner layer 35 may include a thickness of about 15-30 angstroms in the essentially horizontal sections, e.g. along the bottom of the contact opening, but other thicknesses may be used in other exemplary embodiments.

Conductive plug material 39 is formed over liner layer 35. Conductive plug material 39 may be advantageously formed to fill the contact openings and also over the films formed over top surface 7, as illustrated in FIG. 4. According to one exemplary embodiment, conductive plug material 39 may be tungsten, W. In other exemplary embodiments, conductive plug material 39 may be copper, Cu, aluminum, Al, or other suitable conductive materials including various alloys of conductive materials, in other exemplary embodiments. Various suitable deposition techniques may be used to advantageously form conductive plug material 39 to fill contact openings 9 and 11.

Figure 5:
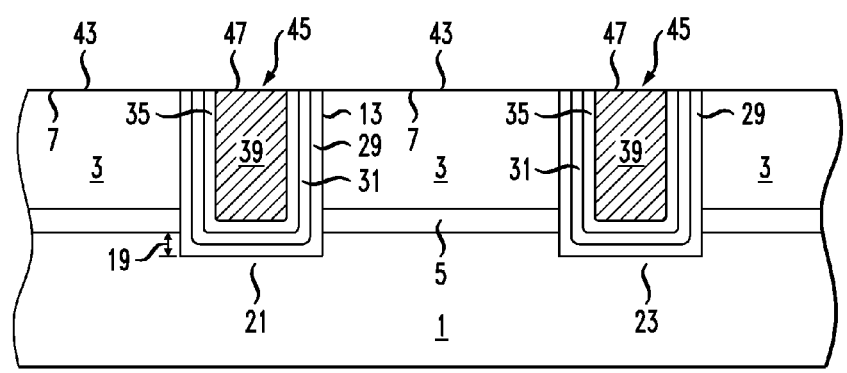

A polishing operation may then be carried out upon the structure shown in FIG. 4, to produce the planarized structure shown in FIG. 5. Chemical mechanical polishing, CMP, or other suitable polishing techniques, may be used to remove materials from over top surface 7 to produce planarized upper surface 43 shown in FIG. 5. Planarized upper surface 43 includes sections of top surface 7 and also contact surfaces 47 of contact structures 45. In some exemplary embodiments, the polishing may cause original top surface 7 to recede. Contact surface 47 may include portions of conductive material 39, liner layer 35, and upper film 31 and lower film 29.

Contact structures 45 shown in FIG. 5 may be used to provide contact between the respective materials that form bottom surfaces 15 and a conductive material formed over the structure shown in FIG. 5 and contacting contact surfaces 47.

According to one aspect, a method is provided for forming a contact in a semiconductor device. The method includes providing a semiconductor device substructure with a dielectric layer having a plurality of contact openings extending therethrough, each contact opening terminating at a respective bottom surface, at least one of the bottom surfaces being a silicide surface and at least one of the bottom surfaces being a further surface. The method further includes forming a composite base layer on the respective bottom surfaces including a multi-step IMP (Ionized Metal Plasma) deposition process, the composite base layer including a lower layer of a first material formed using a high AC bias power and an upper layer of the first material formed using a low AC bias power. The method further includes forming a layer of a second material on the composite base layer using CVD and depositing a conductive plug material in the plurality of contact openings and contacting the layer of second material.

According to another aspect, a method is provided for forming a contact in a semiconductor device. The method comprises providing at least one contact opening through a dielectric layer and terminating at a bottom surface being one of a silicide and a non-silicide surface, forming a high bias IMP titanium layer on the bottom surface using a high AC bias power of about 700 W to about 1500 W, forming a low bias IMP titanium layer on the high bias IMP titanium layer using a low AC bias power of about 200 W to about 700 W, forming a titanium nitride film over the low bias IMP titanium layer and substantially filling the contact opening with tungsten.

According to another aspect, a semiconductor device contact structure is provided. The contact structure is disposed within a contact opening extending through a dielectric layer and terminating at a bottom surface. The contact structure comprises an inner tungsten plug surrounded by a TiN layer surrounded laterally and subjacently by a composite layer of a first material. The composite layer of first material includes an inner layer of a first material having a first resistivity. The inner layer is surrounded laterally and subjacently by an outer layer of the first material having a second resistivity that is lower than the first resistivity, the outer layer contacting the bottom surface. The first material comprises titanium or cobalt.

The preceding merely illustrates the principles of the embodiments. It will thus be appreciated that those skilled in the art will be able to devise various arrangements which, although not explicitly described or shown herein, embody the principles of these embodiments and are included within their spirit and scope. Furthermore, all examples and conditional language recited herein are principally intended expressly to be only for pedagogical purposes and to aid in understanding the principles of the examples and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the structure be constructed or operated in a particular orientation.

Although exemplary embodiments have been described above, they are not limiting. Rather, the appended claims should be construed broadly, to include other variants and embodiments, which may be made by those skilled in the art without departing from the scope and range of equivalents.

What is claimed is:

1. A semiconductor device comprising:
 a contact structure disposed within a contact opening extending through a dielectric layer and terminating at a bottom surface;
 said contact structure comprising an inner plug surrounded by a layer of a first material that is surrounded laterally and subjacently by an inner layer of a second material of a first chemical composition, the inner layer of the second material of the first chemical composition having a first resistivity, said inner layer surrounded laterally and subjacently by an outer layer of said second material of the first chemical composition, the outer layer of the second material of the first chemical composition having a second resistivity that is lower than said first resistivity, said outer layer contacting said bottom surface.

2. The semiconductor device as in claim 1, wherein said bottom surface comprises a silicide surface and said inner layer and said outer layer have a combined thickness of about 250 angstroms or more.

3. The semiconductor device as in claim 2, further comprising a further contact structure disposed within a further contact opening extending through said dielectric layer and wherein said further contact opening terminates at a further bottom surface comprising silicon with a dopant impurity therein.

4. The semiconductor device as in claim 1, wherein said first resistivity is greater than 95 uohm-cm, said second resistivity is less than 95 uohm-cm and said first material comprises titanium.

5. The semiconductor device as in claim 1, wherein said second material comprises Ti and said bottom surface comprises silicon.

6. The semiconductor device as in claim 1, wherein said second material comprises Co.

7. The semiconductor device as in claim 1, wherein said layer of the first material includes a thickness of about 15-30 angstroms.

8. The semiconductor device as in claim 7, wherein said second material comprises Ti, first resistivity is greater than 95 uohm-cm and said second resistivity is less than 95 uohm-cm.

9. A semiconductor device comprising:
a plurality of contact structures disposed within respective contact openings each extending through a dielectric layer, each said contact opening terminating at a respective bottom surface, at least one said bottom surface being a silicide surface and at least one said bottom surface being a further surface;
each said contact structure comprising an inner tungsten plug surrounded by a first material layer surrounded laterally and subjacently by an inner layer of a second material of a first chemical composition, the inner layer of the second material of the first chemical composition having a first resistivity, said inner layer surrounded laterally and subjacently by an outer layer of said second material of the first chemical composition, the outer layer of the second material having a second resistivity that is lower than said first resistivity, said outer layer contacting said bottom surface, said second material comprising one of titanium and cobalt.

10. The semiconductor device as in claim 9, wherein said first material layer comprises WN.

11. The semiconductor device as in claim 9, wherein said further surface comprises a silicon surface with dopant impurities therein.

12. The semiconductor device as in claim 9, wherein said first material layer comprises a titanium nitride film and includes a thickness of about 15 angstroms to about 30 angstroms.

13. The semiconductor device as in claim 9, wherein said second material comprises titanium and said inner and outer layers of said second material layer have a combined thickness of about 250 angstroms or more.

14. The semiconductor device as in claim 9, wherein said second material comprises Co.

15. The semiconductor device as in claim 9, wherein and said inner and outer layers of said second material layer have a combined thickness of about 250 angstroms or more.

16. The semiconductor device as in claim 9, wherein said first resistivity is greater than 95 uohm-cm, said second resistivity is less than 95 uohm-cm and said first material comprises titanium.

17. A semiconductor device comprising:
a plurality of contact structures disposed within respective contact openings extending through a dielectric layer, each said contact opening terminating at a respective bottom surface, at least one said bottom surface being a silicide surface and at least one said bottom surface being a further surface;
each said contact structure comprising an inner conductive plug surrounded by a first material layer surrounded laterally and subjacently by an inner layer of a second material of a first chemical composition, the inner layer of the second material of the first chemical composition having a first resistivity, said inner layer surrounded laterally and subjacently by an outer layer of said second material of the first chemical composition, the outer layer of the second material having a second resistivity that is lower than said first resistivity, said outer layer contacting said bottom surface, said second material comprising one of titanium and cobalt, and wherein said first resistivity is greater than 95 uohm-cm and said second resistivity is less than 95 uohm-cm.

18. The semiconductor device as in claim 17, wherein said conductive plug comprises Cu.

19. The semiconductor device as in claim 17, wherein said first material layer comprises WN and has a thickness of about 15-30 angstroms.

20. The semiconductor device as in claim 17, wherein said first material layer comprises TiN and said inner and outer layers of said second material layer have a combined thickness of about 250 angstroms or more.

* * * * *